United States Patent
Alford et al.

(10) Patent No.: US 10,133,327 B2
(45) Date of Patent: *Nov. 20, 2018

(54) SMART CORD REEL

(71) Applicants: John Alford, Kenosha, WI (US); Mark Schwartz, Wauconda, IL (US); Chris Hinojosa, Winthrop Harbor, IL (US)

(72) Inventors: John Alford, Kenosha, WI (US); Mark Schwartz, Wauconda, IL (US); Chris Hinojosa, Winthrop Harbor, IL (US)

(73) Assignee: Konnectronix, Inc., Gurnee, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/616,647

(22) Filed: Jun. 7, 2017

(65) Prior Publication Data

US 2018/0004263 A1    Jan. 4, 2018

Related U.S. Application Data

(63) Continuation-in-part of application No. 15/175,822, filed on Jun. 7, 2016.

(Continued)

(51) Int. Cl.
| | |
|---|---|
| *G06F 1/26* | (2006.01) |
| *H02G 11/02* | (2006.01) |
| *G01R 31/02* | (2006.01) |
| *B65H 63/00* | (2006.01) |
| *B65H 75/00* | (2006.01) |
| *B65H 63/036* | (2006.01) |
| *B65H 75/40* | (2006.01) |
| *B65H 75/48* | (2006.01) |

(52) U.S. Cl.
CPC ............. *G06F 1/26* (2013.01); *B65H 63/00* (2013.01); *B65H 63/036* (2013.01); *B65H 75/00* (2013.01); *B65H 75/406* (2013.01); *B65H 75/48* (2013.01); *G01R 31/021* (2013.01); *H02G 11/02* (2013.01); *B65H 2701/3919* (2013.01)

(58) Field of Classification Search
CPC ...... G01R 31/00; G01R 31/02; G01R 31/021; G01R 31/06; B65H 63/00; B65H 63/003; B65H 63/006; B65H 63/02; B65H 63/024; B65H 63/028; B65H 63/032; B65H 63/0321; B65H 63/0322; B65H 63/036; B65H 75/00; B65H 75/02; B65H 75/406; B65H 75/48; B65H 2701/3919; G06F 1/26; H02G 11/02
USPC ........................................ 324/500, 537, 539
See application file for complete search history.

(56) References Cited

U.S. PATENT DOCUMENTS

| | | | | |
|---|---|---|---|---|
| 4,411,396 A | * | 10/1983 | Kytir | B65H 54/2884 242/478.1 |
| 5,094,396 A | * | 3/1992 | Burke | B65H 75/44 242/375 |

(Continued)

OTHER PUBLICATIONS

International Search Report and Written Opinion—dated Nov. 16, 2017.

*Primary Examiner* — Hoai-An D. Nguyen

(74) *Attorney, Agent, or Firm* — Vitale Vickrey Niro & Gasey LLP

(57) ABSTRACT

A smart cord reel cable including at least one sensor for measuring cord or cord reel usage, a memory for receiving sensor input to create usage records, and a processor for analyzing the usage records to provide information for maintenance status indication and/or usage analytics.

3 Claims, 6 Drawing Sheets

Related U.S. Application Data

(60) Provisional application No. 62/346,904, filed on Jun. 7, 2016.

(56) References Cited

U.S. PATENT DOCUMENTS

| | | | | |
|---|---|---|---|---|
| 5,498,940 A * | 3/1996 | Kim | ............ | A47L 9/26 191/12.2 A |
| 5,526,997 A * | 6/1996 | Karczmer | ............ | B65H 75/38 191/12.2 R |
| 5,535,960 A * | 7/1996 | Skowronski | ............ | H04M 1/15 191/12.2 R |
| 5,732,898 A * | 3/1998 | Odessky | ............ | B65H 75/4402 191/12.2 R |
| 5,844,494 A * | 12/1998 | Spahlinger | ............ | B65H 63/00 340/511 |
| 5,921,497 A * | 7/1999 | Utley, Jr. | ............ | B65H 75/4449 242/388.6 |
| 6,296,201 B1 * | 10/2001 | Jackson | ............ | B65H 49/02 226/97.4 |
| 6,307,177 B1 * | 10/2001 | Herrich | ............ | B23K 9/12 219/130.01 |
| 6,439,275 B1 * | 8/2002 | Alhomsi | ............ | B67D 7/346 141/231 |
| 7,651,046 B2 * | 1/2010 | Schmalholz | ............ | B65H 54/36 242/157 R |
| 8,123,010 B2 * | 2/2012 | Skowronski | ............ | B65H 75/4423 191/12.2 R |
| 9,211,799 B2 | 12/2015 | Veiga et al. | | |
| 2006/0229779 A1 * | 10/2006 | Sorenson | ............ | B60R 25/00 701/32.3 |
| 2006/0283516 A1 * | 12/2006 | Nagaoka | ............ | B65B 13/285 140/119 |
| 2007/0041726 A1 * | 2/2007 | Lee | ............ | G03B 17/02 396/427 |
| 2010/0275456 A1 * | 11/2010 | Lord | ............ | G01B 3/11 33/706 |
| 2013/0112677 A1 * | 5/2013 | Christopher | ............ | B23K 9/1333 219/137.71 |
| 2014/0077761 A1 * | 3/2014 | Hamrin | ............ | B60L 11/1825 320/109 |
| 2014/0263801 A1 * | 9/2014 | Skowronski | ............ | B65H 75/4449 242/397.5 |
| 2015/0048791 A1 | 2/2015 | Veiga et al. | | |

\* cited by examiner

SMART CORD REEL

RELATED APPLICATIONS

This application is a continuation in part of U.S. patent application Ser. No. 15/175,822, filed Jun. 7, 2016. In addition, this application claims priority to Provisional Application No. 62/346,904, filed Jun. 7, 2016.

FIELD OF INVENTION

The present disclosure relates to a system for the recording and analysis of use of electrical or mechanical cords involving connection to electronics devices, such as an phone, tablet laptop or passenger control unit. More specifically, the present disclosure includes a cord reel having a memory which can be connected to an electronic device such as a phone, tablet laptop or passenger control unit to receive information related to the use of the cord reel and to create records therefrom so as to provide information to authorized personnel for the usage statistics, maintenance, servicing, and/or design improvement of the cord and/or cord reel.

BACKGROUND OF THE INVENTION

Retractable reels have been used in various applications to retractably store various types of cables or cords. For example, one successful cord reel assembly has been developed that comprises a spool on which the extendable portion of cord is held, an expansion chamber in which a fixed length of cable is spirally wound. The two cable portions are connected, typically in or adjacent the hub of the spool. As the spool rotates the spirally wound, fixed cable expands and contracts within the expansion chamber. Examples of reels of this type are disclosed in U.S. Pat. No. 5,094,396 to Burke and U.S. Pat. No. 8,075,335 to Burke et al., the disclosures of which are hereby incorporated by reference.

Retractable cord reels have been used in various applications to retractably store various types of cables. Using a reel provides convenient storage for the cord. The reel also protects the cord from damage, since it need not be left on the ground. Damage to the cord is reduced. In the case of an electrical cord reel, the hazard presented to a user by a damaged electrical cord is also avoided. However, cord usage (e.g., the wear of the cord) may vary, even across (for instance) various cord reels installed in different seats on the same aircraft. Furthermore, given the variance in wear across such similarly situated cords and/or cord reels, the ability to predict and anticipate the need for replacement or repair of a given unit is likely to be a function of the number of uses (i.e., rotations) employed by the given cord reel. A further necessary point of information in judging the durability of such cords and/or cord reels is obtaining knowledge about the installation dates and circumstances relate to such devices. Also, certain types of applications may involve varying usage durations and extensions of the cord, and the knowledge of such usage could benefit the ongoing improvement in design of the cord and/or cord reel. In addition, it may be desirable to predict the next service date for the cord reel assembly, to know the initial installation date of the cord reel assembly, and other information relative to its installation and/or use.

In order to provide a more durable and more reliable system for connecting to and supporting electronics attached to cords and/or cord reels, it is necessary to provide a mechanism to enable the recording of usage of such devices and/or the prediction of the failure of such devices. The needs for such a system also exist in other areas outside of an aerospace application, such as in a retail environment, where data about the duration of frequency and use may be used in addition or separate from maintenance requirements, such as a retailer's need to track the frequency and duration that customers pick up and use floor samples of a given device tethered via cord for security purposes.

To date, however, there are no available products that permit a cord or cord reel assembly to provide a mechanism to record usage events, nor do any available devices provide a method for anticipating the need for replacement of such devices prior to failure.

What is needed is system including the ability to record and analyze events related to the usage of cord or a cord reel assembly.

Definition of Terms

The following terms are used in the claims of the patent as filed and are intended to have their broadest plain and ordinary meaning consistent with the requirements of the law.

The "processor" refers to a computer that can be accessed by authorized personnel, such as a service technician, flight crew, flight attendant, owner, agent or the like through a number of different structures, such as through interrogation of a given cord reel by a wireless device having the processor external to the cord reel assembly, and/or a cloud or remote server based processor for gathering sensor information each of a plurality of cord reel assemblies, and/or a processor located on the cord reel assembly which can be interrogated by a tablet or the like operated by the technician, or which can be accessed through a display panel electrically connected to the cord reel assembly.

The "first sensor mechanism" refers to circuitry for detecting and measuring rotational movement, such as one or more magnets in combination with a Hall effect sensor, or an optical sensor (e.g., for use with a color coated cord) or the like.

"Usage analytic records" means data structures that are generated and recorded related to the installation and operation of the cord reel assembly, including for instance, first date in use, serial number, maintenance records, install type, installation location and parameters, frequency of use, and extent of use.

A "maintenance access mechanism" is a mechanical and/or wireless interface for enabling a maintenance worker to access an additional portion of the cord including the connector for replacement and/or service. Examples of such mechanisms include a solenoid actuated by remote wireless interface, a hidden mechanical button such as one on the holder, or a discreet tool-actuated aperture on the holder so as to unlock access to the additional portion of the cord.

A "maintenance worker" means any authorized personnel, such as a service technician, flight crew, flight attendant, owner, agent or the like.

A "connector" means an electrical and/or mechanical connection between two segments of a cord that include a locking mechanism for normal cord usage that can be released or decoupled during service events. An example of such connectors would be barrel connectors or the like.

Where alternative meanings are possible, the broadest meaning is intended. All words used in the claims set forth below are intended to be used in the normal, customary usage of grammar and the English language.

Objects and Summary of the Disclosure

The apparatus and method of the present disclosure generally includes a cable (either data, electrical or mechanical) that is preferably connected to cord reel housing or spool, or alternatively another container. Such a smart cord reel system will typically include at least one of two sensors: 1) a sensor for measuring the rotation of a cord reel spool within the housing and/or: 2) a sensor for measuring at least one of the voltage, the resistance or the amperage flow within the cord. The smart cord reel system will typically include at least one memory for receiving an input from each of the sensor(s), where the memory stores records from the inputs provided by the sensors, and sensor is accessible by a processor (whether local to the cord reel system, proximate in the form of a laptop or other handheld interrogation device, or remote as in a server connection), wherein the processor can—among other tasks—compare the records in memory against predetermined limits to provide a status signal therefrom to indicate whether the replacement or repair of the cord reel assembly or some component thereof is required.

The immediate application of the present invention will be seen in large scale cord reel placements (e.g., retractable data and low voltage power cord reel connections for controller and/or electronics on aircraft), though those of skill will see that the present invention could be applied to electrical and non-electrical cord reels and/or non-vehicle usage (e.g., retail security usage, consumer and commercial electronics usage) where information about the usage and/or wear of the cord reel may be advantageous.

Thus can be seen that one object of the present invention is to provide a mechanism for predicting the need to replace a cable or other component in a cord reel assembly.

A further object of the present invention is to provide a mechanism for predicting the need to replace the cord reel assembly as a whole.

Still another object of the present invention is to provide a cord or cord reel assembly that records usage events for analyzing the ways in which a cord or cord reel assembly is used.

Yet another object of the present invention is to provide a cord reel assembly that provides status information about the assembly to authorized personnel.

Still another object of the present invention is to provide a cord reel assembly which reduces or eliminates down time of a given cord or cord reel assembly, as well as providing usage information that can be employed to improve the future design of the cord reel assembly so as to better perform in a given environment.

A further object of the present invention is to provide a cord reel assembly having a stationary cord end and a retractable cord end, the assembly having a more compact profile.

Still another object of the present invention is to provide a retractable cord reel assembly having a stationary cord end and a retractable cord end, the cord reel assembly including a reliable electrical contact for providing power and or data to a personal control unit.

Yet a further object of the present invention is to provide a reliable mechanism for removal of a cord reel unit by service personnel without compromising the normal operation of the system.

It should be noted that not every embodiment of the claimed invention will accomplish each of the objects of the invention set forth above. In addition, further objects of the invention will become apparent based on the summary of the invention, the detailed description of preferred embodiments, and as illustrated in the accompanying drawings. Such objects, features, and advantages of the present invention will become more apparent in light of the following detailed description various embodiments thereof, and as illustrated in the accompanying drawings.

DETAILED DESCRIPTION OF THE INVENTION

Set forth below is a description of what is currently believed to be the preferred embodiment or best examples of the invention claimed. Future and present alternatives and modifications to this preferred embodiment are contemplated. Any alternatives or modifications which make insubstantial changes in function, in purpose, in structure or in result are intended to be covered by the claims in this patent.

Figure 1:
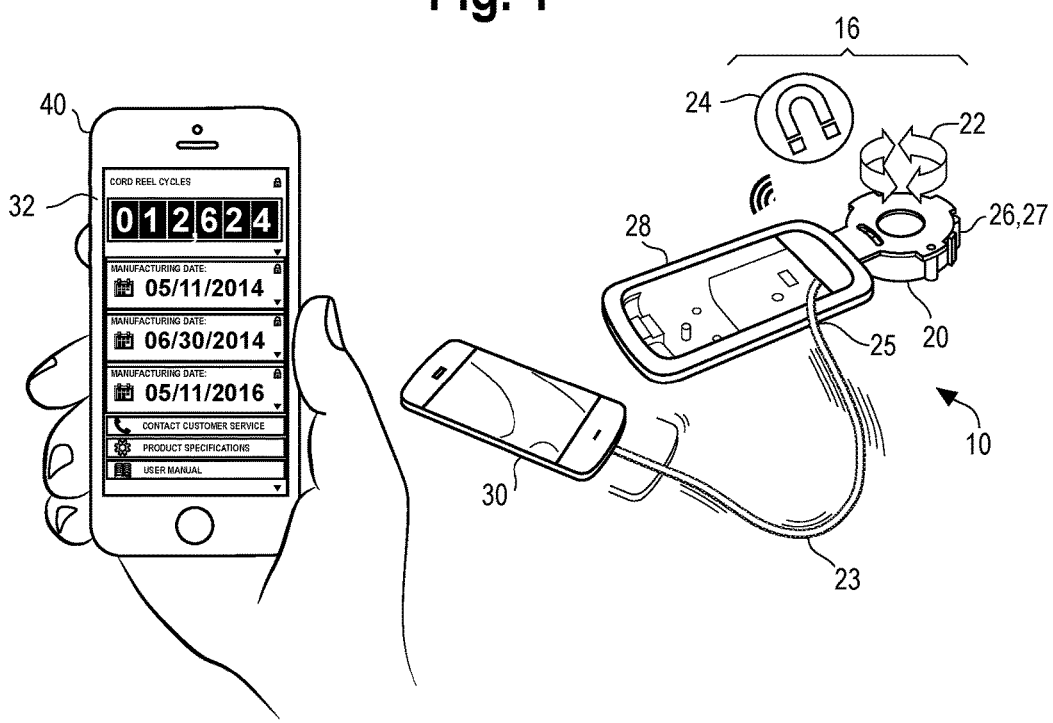
FIG. 1 shows a first example embodiment of cord reel assembly with a rotational sensor for a cord reel spool in accord with a preferred embodiment of the present invention.
Figure 2:
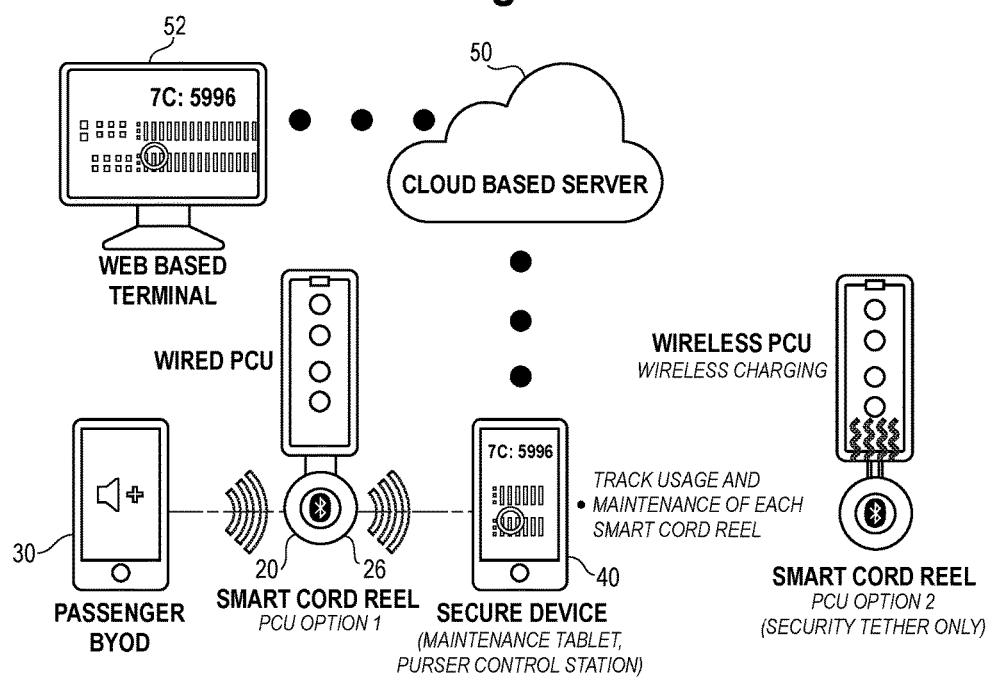
FIG. 2 shows alternative schematics for a smart cord reel assembly using local and remote processing capabilities in accord with alternative embodiments of the present invention.

FIG. 1 shows an example smart cord reel system 10 in accord with a first preferred embodiment of the present invention. Specifically, the assembly includes a cord reel assembly that is preferably comprised of a housing 20 that has a spool 22 contained inside. The spool 22 rotates relative to the housing 20 so as to retract or extend a cord 23 therefrom. The cord 23 is connected at the end opposite of the spool 22 to a personal control unit 30 (also known as a passenger control unit), which could be any of a smart phone, a laptop, a dedicated video entertainment device (which can be stored on a cradle 28) or even a remote control or the like. The cord 23 will typically supply data and/or power to the personal control unit 30, though another alternative (as shown in FIG. 2) would provide for a wireless connection between the personal control unit and the spool, such that the sole purpose of the cord 23 in such an alternative embodiment would be for security and tethering.

Also contained with the housing 20 is a sensor 24 for measuring each complete rotation of the spool 22 within the housing 20. In this preferred embodiment, the sensor 24 is a Hall effect sensor that works with one or more magnets on the spool 22 to count each compete rotation of the spool, though persons of skill in the art will understand that other alternative structures may be used for measuring spool rotation, such as an optical sensor in combination with a color coated cord. In addition (or as an alternative to the rotational sensor 24), the housing may further include a second sensor 25 for measuring the voltage and/or the resistance and/or the amperage of the cord.

Each of these sensors 24, 25 are electrically connected to a memory 26. As shown in FIG. 2, the memory 26 can be located within the housing 20 of a given unit, or it can be transmitted (via Bluetooth or similar communications protocol) to a nearby maintenance tablet 40 or similar secure device which can be accessed by authorized personnel (e.g., maintenance personnel or flight crew). In this embodiment, the maintenance tablet 40 could receive and record separate usage events for each of a large number of personal control units 30 (e.g., each seat on an airplane, wherein each seat has its own personal control unit). Alternatively, the system 10 could link to a remote server 50 which records and stores the stores the usage events in a memory thereon.

Regardless of the location of the memory 26, the usage records stored thereon in the present disclosure are accessible by at least one processor 32, which may be located (for instance) on the maintenance table 40 or the remote server. Depending upon the desired configuration, the output of the processor can be displayed on the maintenance tablet 40 or a remote web based terminal 52 or the like. In one embodiment, the processor can compare the input of the sensors (e.g., the usage record) against preselected limits to determine whether the cord reel is working within normal operational or life expectancy parameters.

For instance, the sensor 24 may have recorded 5996 rotations in a given personal control unit (e.g., seat 7C of an aircraft, as reflected in FIG. 2). The manufacturer of the cord reel assembly may have (for instance) mandated that the cord or cord reel be replaced at 8000 rotations. Furthermore, the manufacturer may decide that it is advisable to warn the operator that replacement will be required soon in the event that the usage approaches that limit. For instance, using the example of FIG. 2, the processor 30 may flash a warning or "yellow" signal after the personal control unit 30 in question has passed 6000 rotations, while flashing a "red" or immediate replacement signal once the preselected limit of 8000 rotations has been exceeded.

Of course, those seeing the disclosure of the present disclosure will understand that its advantages are not limited to monitoring of normal maintenance and replacement events. For instance, the second sensor 25 may also record a decrease in resistance values or a spike in voltage or amperage indicative of a fault or other abnormal events. The system 10 can provide for recording of such events in memory 26 such that the processor 30 can compare such event records against preset operating values stored in a memory 26 to determine if another status signal should be generated on the display of the maintenance tablet 40 or the web terminal 52 to instruct authorized personnel to replace the cord 23 or the cord reel assembly 16.

Furthermore, the events recorded in memory may not be directly related to wear and tear or malfunction, but may simply relate to operating metrics to facilitate the analysis of operation of the system 10 for marketing analytics or ongoing improvements in maintenance and/or design. Examples of such operating metrics can include, by way of example, first date in use (e.g., to track the expect amount of time in the field prior to replacements), serial number, maintenance records (including a recommended date for next maintenance), install type, installation location and parameters, frequency of use, and extent of use. In such time sensitive measurements, those of skill in the art would understand that a clock 27 would be required in addition to the memory 26 to provide the appropriate time stamp or similar tracking. The addition of a clock 27 in combination with the usage records could permit (for instance) alteration of the recommended date for next maintenance based upon changes in the frequency of use.

The analysis by the processor 30 could also entail analysis of usage records which impact the ongoing redesign of the cord reel assembly. For instance, a number of cord reel assemblies 16 might provide information from their respective sensors 24 indicating (for instance) that the vast majority of cord extensions for a given unit involve far less than the full length that the cord 23 may be extended, thus prompting the designers to provide alterations to the design of the cord reel assembly 16 with a shorter cord 23, thereby providing cost savings to the system 10.

Another alternative of usage analytics would be particularly applicable to a security application of the cord reel assembly. For instance, a series of cord reel assemblies 16 might provide information from sensors 24 and/or 25 indicating that various attached electronic devices had been picked up at a given times and/or powered for a given durations. The records related to such sensor information could be used by processor 30 to create analytic records to indicate (for instance) the trend of usage of the various attached electronic devices, and therefore infer or otherwise provide data showing the comparative popularity of the respective attached electronic devices.

Figure 3:
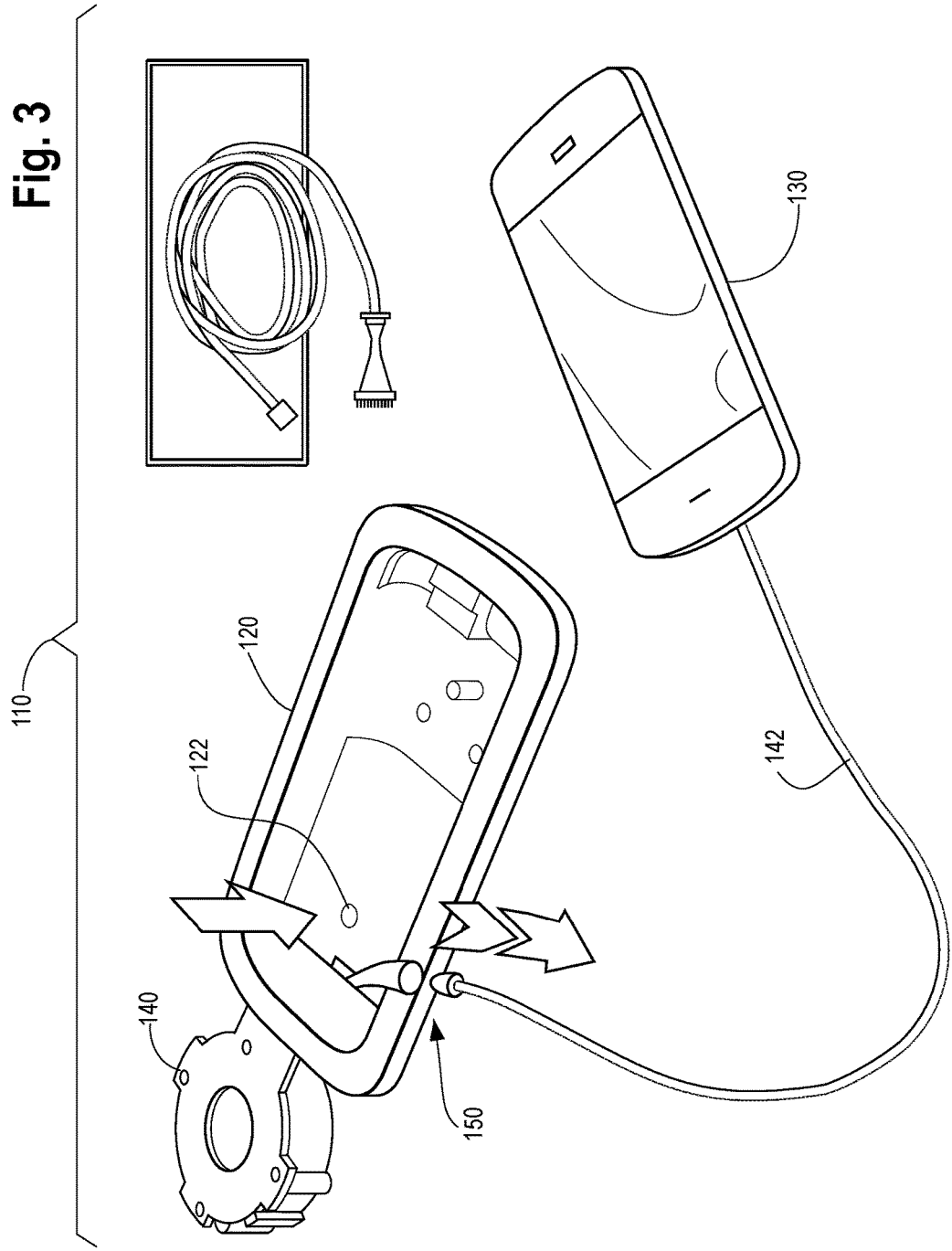
FIG. 3 shows an example embodiment of cord reel assembly with a removable cord segment and a maintenance release mechanism in accord with a preferred embodiment of the present invention.

FIG. 3 shows an example cord reel system 110 in accord with a second preferred embodiment of the present invention for use with the smart cord reel system of the present invention (e.g., a mechanism for replacing a cord reel unit in an instance where the smart cord reel has a yellow or red signal has been incurred). The basic components of this embodiment of the system include a holder 120, a user interface module 130, and a cord reel unit 140.

The cord reel unit 140 can be of a variety of models such as the type found in U.S. Pat. No. 5,094,396 to Burke, the subject matter of which is hereby incorporated by reference, or U.S. Patent Application No. 2007/0262185 to Burke, the subject matter of which is also hereby incorporated by reference, or U.S. Pat. No. 8,075,335 to Burke et al., which is likewise incorporated herein by reference. The cord 142 extending from the cord reel unit 140 is typically an electric cord reel which can supply power and/or data to the user interface module 130, though the cord 142 of the present invention could be simply limited to a mechanical attachment or tether to the user interface module 130, e.g., in the event of a wireless communication with any such user interface module 130.

The user interface module 130 (also known as a passenger control unit) could be any of a smart phone, a laptop, a dedicated video entertainment device or even a remote control or the like.

The holder 120 can be connected, for instance, to an interior surface of an aircraft or vehicle. In this embodiment, the holder 120 is a cradle for a phone or passenger control unit, though people of skill will understand that the holder could incorporate other types of surfaces, too. In this embodiment, holder 120 includes a maintenance access mechanism 122 which in this embodiment is a button, which could optionally include a friction fit cover (not shown) to hide its presence from a user/passenger. Alternatively, the button 122 could be hidden in a less visible portion of the holder so as not to be easily actuated by a passenger. Likewise, the button 122 could take alternative forms, such as a tool actuated aperture (a so called "toothpick" opening)

so as to be inaccessible by a user, or it could involve a wireless connection. Regardless of the alternative structure used, the button 122 is designed to open a solenoid (not shown) or similar lock such as a Nitinol or "muscle metal" latch with prevents the cord 142 from extending fully outside of the opening in the holder 120. By so unlocking, the portion of the cord 142 that includes the connector 150 is exposed. In this preferred embodiment, connector 150 is a barrel type connector, such as barrel type connectors sold by Switchcraft and Carlisle Interconnect, though people of skill in the art having the present teaching will be able to use other alternative connectors based upon the needs of the application. Thus exposed, the authorized personnel (e.g., the service technician or flight crew member) who actuated the maintenance actuation mechanism can easily decouple the connector 150 to swap the cord 142 with a replacement cord.

Figure 4:
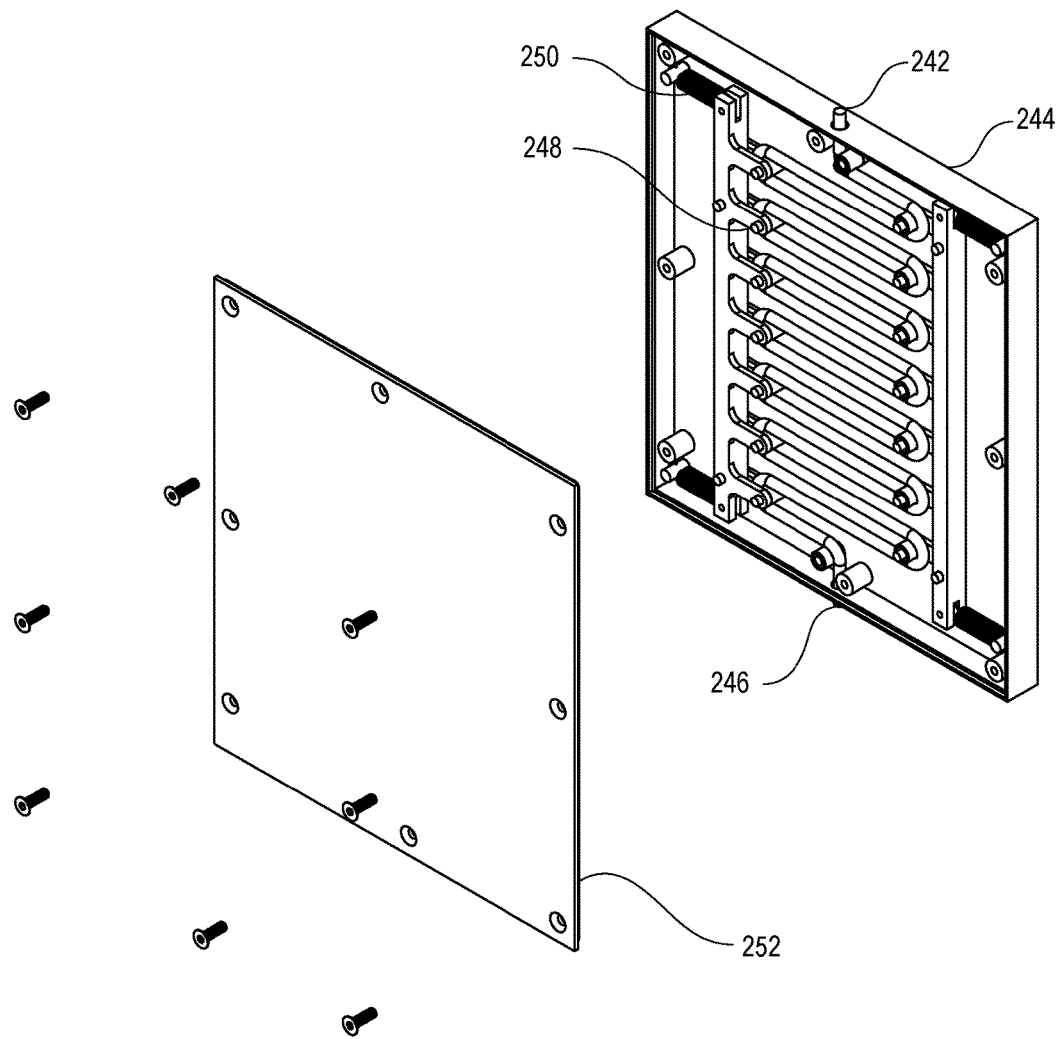
FIG. 4 shows an exploded view of an alternative retractable cable mechanism for use with an alternative embodiment of the present invention.
Figure 5:
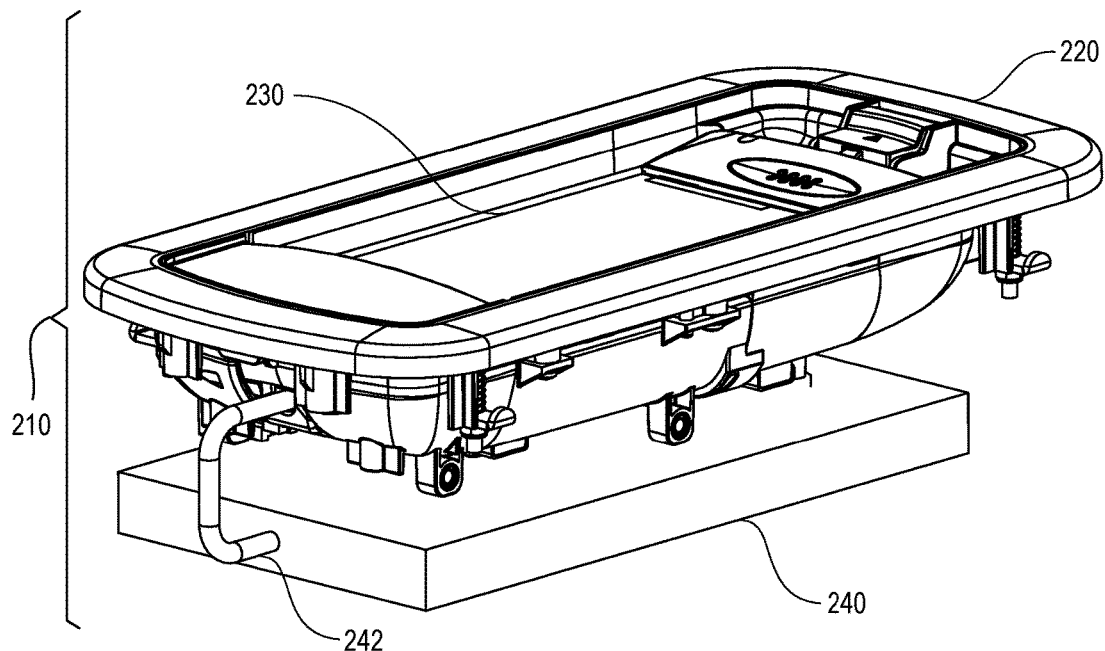
FIG. 5 shows an alternative embodiment of the cord reel assembly using the retractable cable mechanism of FIG. 4.

As shown in FIGS. 4 and 5, the smart cord reel system of the present invention can alternatively be used with a retractable cable or cord mechanism in lieu of a cord reel mechanism. In this alternative embodiment, the assembly 210 comprises a cradle 220, a handset 230 (or any other personal control unit), and a cord management unit 240, which extends and retracts a retractable cable for use. In this embodiment, in lieu of a reel, the cord management unit 240 comprises a housing 244 and a cover 252 for containing the retractable cable 242 when retracted. The cord management unit 240 enables retraction and extension of the cable through a roller mechanism 248 which works cooperatively with a series of springs so as to slide or collapse the rollers of the roller mechanism together to allow for more slack to support extension of the retractable cable 242 as needed, while maintaining the other end of the cable 246 stationary. In such instances, the sensors 24, 25 for determining usage of the retractable cord as discussed in FIGS. 1 and 2 may be connect to the roller mechanism 248 to the processor and memory (not shown) to determine the number of extension cycles for the retractable cable and compare the number of extensions against predetermined limits, if desired.

Figure 6:
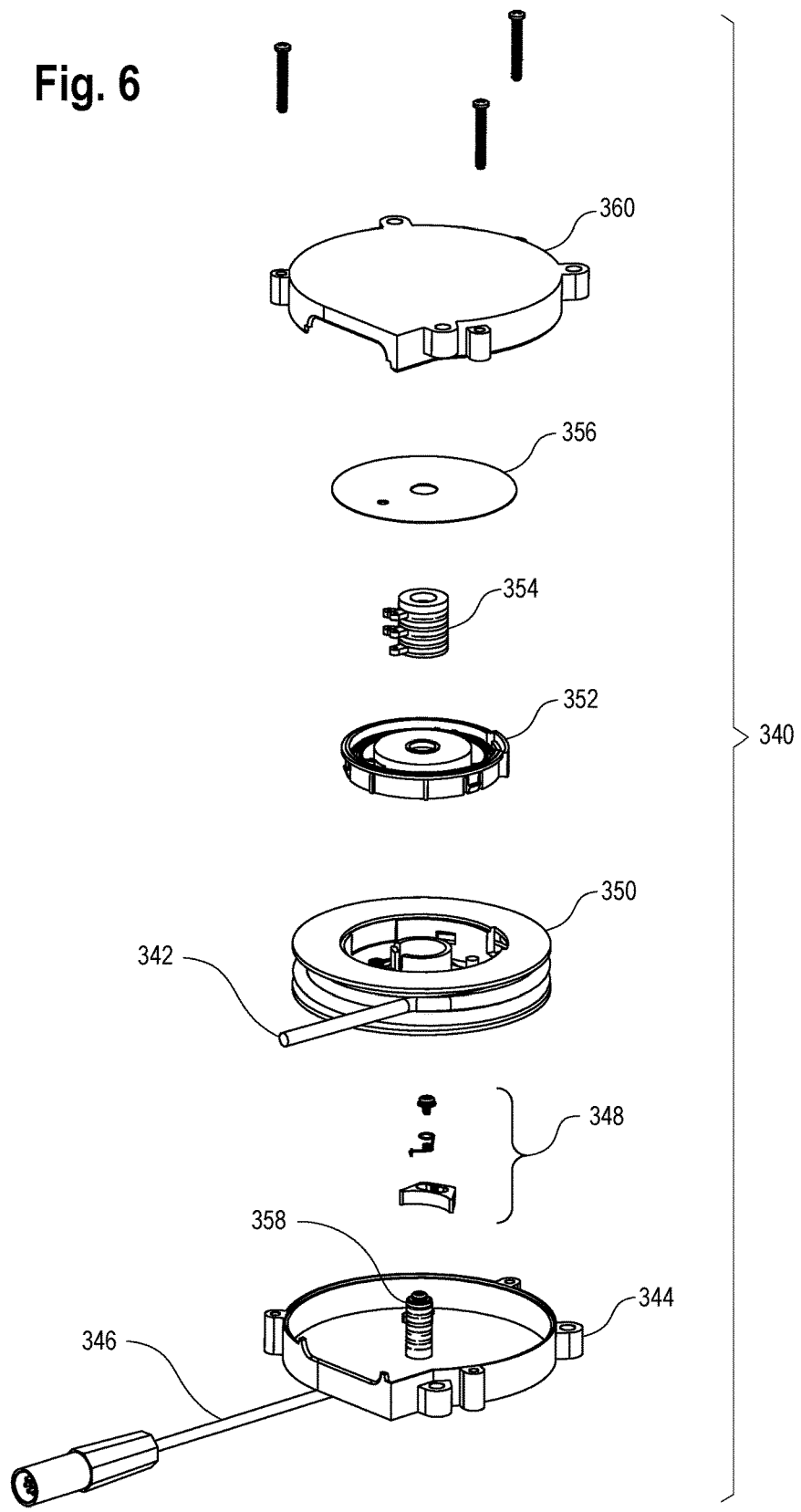
FIG. 6 shows yet another alternative cord reel for use with the smart cord reel system of the present disclosure.

Further, it can be seen that other, alternative embodiments of the cord reel unit may be used in the present invention. For instance, as shown in FIG. 6, the present invention can include a cord reel unit 340 comprising a housing 344 and a cover 360 for retaining and extending a retractable cable 342 around a spool 350. The cord reel unit may optionally include a ratchet mechanism 348 for limiting the retractable movement of the retractable cable 342. The cord reel unit 340 enables transmission of power, electrical and/or optical signals from the retractable cable 342 to the stationary cable 346 via a slip ring mechanism (which can, alternatively, comprise a ball seal mechanism). The Slip ring mechanism in this embodiment comprises an inner slip ring 358 which rotatably and substantially continuously contacts the outer slip ring 354 for transmitting between the stationary cable 346 and the retractable cable 342, with the slip ring mechanisms being held in place by the spring spacer 356 and the spring and retainer 352.

The above description is not intended to limit the meaning of the words used in the following claims that define the invention. Rather, it is contemplated that future modifications in structure, function or result will exist that are not substantial changes and that all such insubstantial changes in what is claimed are intended to be covered by the claims. For instance, the specific spool rotation sensing mechanism used in the examples of the preferred embodiments of present invention is for illustrative purposes with reference to the example drawings only. Similarly, while the preferred embodiments of the present invention are focused upon use within a cord reel assembly, those of skill in the art will understand that the invention has equal applicability to cable sensors related to resistance, voltage and amperage characteristics that are independent of the operation of a spool (or even without need for a cord assembly that uses a spool). In addition, persons of skill will appreciate that the present invention will have particular applicability to security application including, for instance, point of sale displays that require a secure connection to electronics devices being offered for sale. Likewise, it will be appreciated by those skilled in the art that various changes, additions, omissions, and modifications can be made to the illustrated embodiments without departing from the spirit of the present invention. All such modifications and changes are intended to be covered by the following claims.

What is claimed is:

1. A smart cord reel system including a maintenance prediction mechanism for anticipating and predicting the need for replacement, the system comprising:

a) a cord reel assembly, including a housing having a spool and a retractable cord segment that is retracted and extended from the housing, a stationary cord segment extending from the housing, and a slip ring mechanism located within the housing for electrically connecting and transmitting between the stationary cord and the retractable cord segment, a first sensor for measuring each complete rotation of the spool within the housing and a second sensor for measuring the voltage of the cord;

b) at least one memory located within the cord reel assembly for receiving an input from the first sensor correlating to each complete rotation of the spool within the housing and keeping count of the sum of such rotations and receiving an input from the second sensor representative of at least one of the electrical resistance of the cord, the voltage level of the cord or the current received through the cord; and c) a processor electrically connected to the at least one memory for comparing the sum of rotations for the electric cord reel assembly against predetermined limits and providing a status signal therefrom to indicate whether the replacement of the electric cord reel assembly is required, and the processor further connected to the at least one memory for comparing the input from the second sensor representative of the electrical resistance of the cord against predetermined limits stored in memory and generating a status signal therefrom to indicate whether replacement of at least a portion of the cord reel assembly is required prior to occurrence of a malfunction.

2. A smart cord reel system including a maintenance prediction mechanism for anticipating and predicting the need for replacement, the system comprising:

a) a cord reel assembly, including a housing having a spool, a retractable cord segment that is retracted and extended from the spool, and a stationary cord segment extending from the housing, and a slip ring mechanism located within the housing for electrically connecting and transmitting between the stationary cord and the retractable cord segment, and at least a first sensor;

b) at least one memory and a clock connected thereto located within the cord reel assembly for receiving an input from the first sensor correlating to each complete rotation of the spool within the housing and keeping count of the sum of such rotations and receiving an input from the second sensor representative of the electrical resistance of the cord; and c) a processor electrically connected to the at least one memory for receiving data representative of rotations for the cord reel assembly, and generating usage analytic records therefrom, the processor further connected to the at least one memory for comparing the analytic records against predetermined limits stored in the at least one memory and generating a status signal therefrom to indicate whether replacement of at least a portion of the cord reel assembly is required prior to occurrence of a malfunction.

3. A smart cord reel system including a mechanism for delivering usage analytic records related to electronic devices attached thereto, the system comprising:

a) a cord reel assembly, including a housing having a spool and a retractable cord segment that is retracted and extended from the cord a stationary cord segment extending from the housing, and a slip ring mechanism located within the housing for electrically connecting and transmitting between the stationary cord and the retractable cord segment, and sensor;

b) at least one memory located within the cord reel assembly for receiving an input from the sensor correlating to at least one of i) rotation of the spool within the housing; ii) the voltage within the cord; iii) the resistance within the cord; or iv) the amperage flow within the cord; and c) a processor electrically connected to the at least one memory for receiving data representative of the input from the sensor, and generating usage analytic records therefrom, the processor further connected to the at least one memory for comparing the analytic records against predetermined limits stored in the at least one memory and generating a status signal therefrom to indicate whether maintenance of at least a portion of the cord reel assembly is required prior to occurrence of a malfunction.

* * * * *